United States Patent [19]
Magee

[11] 3,772,077
[45] Nov. 13, 1973

[54] SEMICONDUCTOR DEVICES

[75] Inventor: Vincent Magee, Stockport, England

[73] Assignee: Ferranti, Limited, Hollinwood, England

[22] Filed: Apr. 6, 1971

[21] Appl. No.: 131,742

[52] U.S. Cl. .................. 117/212, 117/213, 117/217, 117/130 E
[51] Int. Cl. .................. H01l 7/34
[58] Field of Search .................. 117/8, 212, 213, 117/217, 227; 29/596

[56] References Cited

UNITED STATES PATENTS

| | | | |
|---|---|---|---|
| 3,579,375 | 5/1971 | Wonilowicz et al. | 117/212 |
| 3,212,918 | 10/1965 | Tsu et al. | 117/61 X |

OTHER PUBLICATIONS

Burns; R. M. et al., Protective Coatings for Metals, Reinhold Publ., N.Y., 1955, pp. 201–202.

*Primary Examiner*—Ralph S. Kendall
*Attorney*—Cameron et al.

[57] ABSTRACT

Aluminum of a contact for a semiconductor device is rendered solderable, or a region of the aluminum selectively is rendered solderable, by depositing from a solution of zinc oxide and a hydroxide of an alkali metal a first zinc layer, which is removed, and a second zinc layer initially having an activated surface, and then depositing a nickel layer on the activated zinc surface by reducing an acid solution of a nickel salt.

13 Claims, 10 Drawing Figures

SEMICONDUCTOR DEVICES

This invention relates to contacts for semiconductor devices. Each such contact may extend, from a region where it is contiguous with a semiconductor body, over a passivating layer, providing for a member to be electrically connected to the contact a bonding pad on the passivating layer remote from the region contiguous with the semiconductor body. For convenience in this specification and claims the term "contact" will be used to include structures having such bonding pads.

It is an object of the present invention to provide for semiconductor devices contacts employing aluminum and being such that they may be soldered, contacts having bonding pads being such that the bonding pads selectively may be soldered, for example, with a conventional tin-based solder.

According to the present invention a method of forming a contact for a semiconductor device comprises providing an aluminum layer which extends through an aperture in a layer of passivating material on the contact-bearing face of the device, depositing chemically on at least a region of the exposed aluminum surface a first, temporary, layer of zinc from a solution of zinc oxide and a hydroxide of an alkali metal such as sodium, removing the first zinc layer by etching with nitric acid solution, depositing on the re-exposed region of the aluminum surface a second, permanent, zinc layer in the same manner as the first zinc layer, the second zinc layer initially having an activated surface, and depositing a layer of nickel on the activated surface of the zinc layer by the action of a suitable reducing agent on an acid solution of a nickel salt.

By such a method the aluminum and the zinc, and the zinc and the nickel adhere satisfactorily together. Further, the reducing agent in the acid solution of the nickel salt does not attack the passivating layer on the contact-bearing face of the device.

The exposed nickel surface may be soldered with a conventional tin-based solder in a suitable solder coating process, the solder not adhering to any exposed region of the aluminium surface.

The nickel salt may be nickel chloride. The reducing agent for the nickel salt may comprise either sodium hypophosphite or sodium borohydride.

According to another aspect the present invention comprises a semiconductor device with a contact formed in accordance with the method referred to above.

The present invention will now be described by way of example with reference to the accompanying drawings, in which FIGS. 1 to 5 illustrate successive stages in the formation of a contact on a semiconductor device, and FIGS. 6 to 10 correspond to FIGS. 1 to 5 but relate to a contact having a bonding pad.

Figure 1:
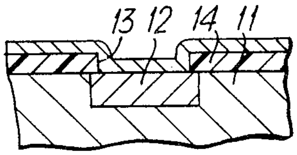
Figure 2:
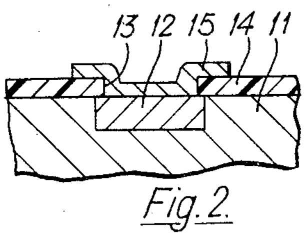

A semiconductor device 10, such as a diode, is formed by known diffusion steps in a silicon semiconductor wafer 11 shown partially in FIG. 1, and a contact to one region 12 the device extends through an aperture 13 in a passivating layer 14 of silicon oxide on the contact-bearing device face. An initially continuous layer of aluminum is deposited over the passivating layer 14, and the aluminum layer is etched by known photolithographic techniques to form the contact part 15 as shown in FIG. 2. The aluminum contact part 15 extends over the passivating layer 14, and extends through the aperture 13 in the passivating layer and makes ohmic contact with the silicon of the wafer 11 after being sintered at a temperature of 500°C.

Figure 3:
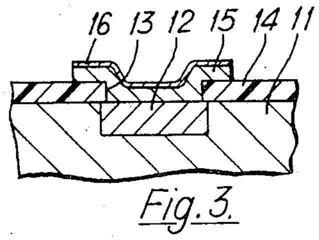

In order to make the contact part 15 of a form suitable for soldering by a conventional tin-based solder the exposed aluminum surface is treated in the following manner. A first, temporary layer of zinc (not shown) is deposited chemically on the exposed aluminum surface from a solution in water of 10 percent by weight of zinc oxide and 20 percent by weight of sodium hydroxide, the solution having free sodium and zincate ions. The first zinc layer is then removed by etching with a solution in water of 50 percent by weight of nitric acid. As shown in FIG. 3 a second, permanent layer of zinc 16 is deposited on the re-exposed aluminum surface, the second zinc layer being formed in the same manner as the first zinc layer, and when so provided adheres satisfactorily to the aluminum surface and initially has an activated surface.

Figure 4:
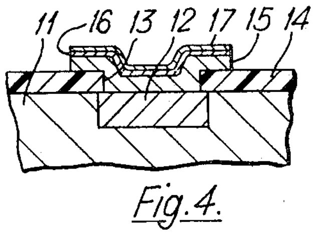

As soon as possible after the deposition of the zinc layer 16 and before the zinc surface becomes deactivated, a layer on nickel 17 is deposited of the zinc layer as shown in FIG. 4. The nickel layer 17 so deposited adheres satisfactorily to the zinc layer 16. The nickel layer is formed by reducing an acid solution of nickel chloride with sodium hypophosphite or sodium borohydride. The acid solution, including the reducing agent, does not attack the passivating oxide layer 14.

Figure 5:
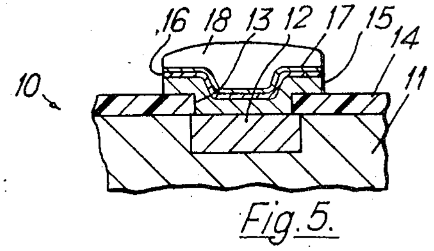
Figure 6:
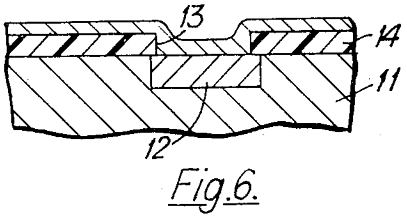
Figure 7:
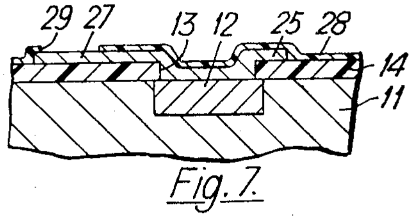
Figure 8:
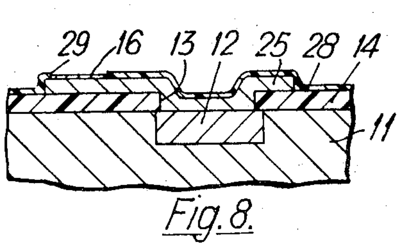
Figure 9:
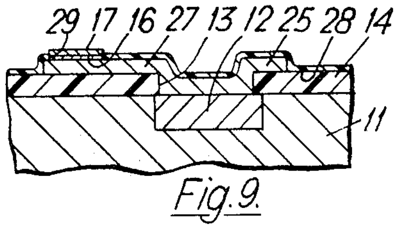
Figure 10:
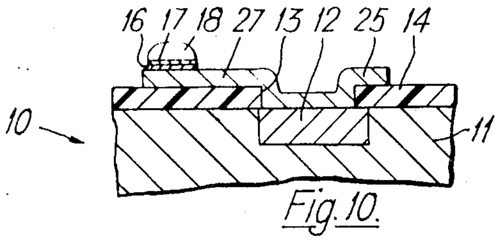

The nickel surface may then be soldered with a conventional tin-based solder in a suitable solder coating process, the solder being indicated at 18 in FIG. 5.

FIGS. 6 to 10 correspond to FIGS. 1 to 5, and parts closely resembling or identical with parts of the embodiment of FIGS. 1 to 5 are given the same reference numbers. In the embodiment of FIGS. 6 to 10 the initially continuous layer of aluminum deposited over the passivating layer 14, and extending through the aperture 13 in the passivating layer, is etched by photolithographic techniques to form a contact part 25. As shown in FIG. 2, the aluminum contact part 25 extends over the passivating layer 14 and provides for a member (not shown) to be electrically connected to the contact a bonding pad 27 remote from the region within the aperture 13 in the passivating layer. The aluminum contact part 25 is then covered with a layer 28 of silicon oxide evaporatively deposited on the part 25. An aperture 29 is etched by photolithographic techniques in the silicon oxide layer 28 to expose the surface of the aluminum region comprising the bonding pad 27. This exposed region of the aluminum surface is then selectively treated in the same manner as the aluminum contact part 15 of the embodiment of FIGS. 1 to 5. The silicon oxide masking layer 28 over the aluminum contact part may be removed. This removal may be either before or after the soldering of the bonding pad, because solder will not adhere to an exposed aluminum surface, but it will adhere to the bonding pad which has been treated in the manner according to the present invention.

The contacts formed in either of the two embodiments described above may be bonded to wires or to rigid conductors, and the rigid conductor may be selectively soldered on the regions to co-operate with contacts on the semiconductor devices. If the rigid conductors are of aluminum, and are mounted on suitable substrates, the conductors may be selectively partially soldered in a method similar to that described above with reference to the selective soldering of a bonding pad of a contact on a semiconductor device. The masking layer over each such conductor may comprise solely the photo-resist employed in the photolithographic etching of the aperture in the masking layer to expose the selected region of the conductor to be soldered.

What I claim is:

1. A method of forming on a face of a semiconductor body a contact for a semiconductor device within the semiconductor body, the method comprising providing a layer of passivating material on the contact-bearing face of the semiconductor body, forming an aperture in the layer of passivating material to expose a region of the semiconductor body where the contact is required, providing a layer of aluminum to extend through the aperture in the layer of passivating material, depositing chemically on at least a region of the exposed aluminum surface a first, temporary, layer of zinc from a solution of zinc oxide and a hydroxide of an alkali metal, removing the first zinc layer by etching with nitric acid solution, depositing on the reexposed region of the aluminum surface a second, permanent, zinc layer in the same manner as the first zinc layer, the second zinc layer initially having an activated surface, and depositing a layer of nickel on the activated surface of the zinc layer by the action of a suitable reducing agent on an acid solution of a nickel salt.

2. A method as claimed in claim 1 in which the exposed nickel surface has been soldered with a tin-based solder.

3. A method as claimed in claim 1 in which the nickel salt is nickel chloride.

4. A method as claimed in claim 1 in which the reducing agent for the nickel salt is selected from the group sodium hypophosphite and sodium borohydride.

5. A method as claimed in claim 1 further including, prior to the deposition of said first layer of zinc, covering said aluminum with an insulative layer and removing a portion of said insulative layer to expose an aluminum surface.

6. A method as claimed in claim 1 wherein said step of providing a layer of aluminum includes extending said layer of aluminum over said passivating layer to a region remote from the aperture in the layer of passivating material, depositing on said aluminum layer a layer of silicon oxide and forming an aperture on the silicon oxide layer to expose a portion of the surface of the aluminum layer.

7. A method as claimed in claim 6 further including the step of removing the layer of silicon oxide over the portion of the aluminum layer extending through the aperture in the layer of passivating material.

8. A method of forming on a face of a semiconductor body a contact for a semiconductor device within the semiconductor body, the method comprising providing a layer of passivating material on the contact-bearing face of the semiconductor body, exposing a region of the contact-bearing face of the semiconductor body where the contact is required, providing a layer of aluminum extending over the exposed region, depositing on the layer of aluminum at a selected region a layer of zinc from a solution of zinc oxide and a hydroxide of an alkali metal, removing the zinc layer at the selected region, depositing on the exposed region of the aluminum surface a zinc layer, said latter zinc layer initially having an activated surface, and depositing a layer of nickel on the activated surface of the zinc layer by the action of a suitable reducing agent on an acid solution of a nickel salt.

9. A method as claimed in claim 8 in which the exposed nickel surface has been soldered with a tin-based solder and the nickel salt is nickel chloride.

10. A method as claimed in claim 8 in which the reducing agent for the nickel salt is selected from the group sodium hypophosphite and sodium borohydride.

11. A method of forming on a face of a semiconductor body a contact for a semiconductor device within the semiconductor body, the method comprising providing a layer of passivating material on the contact-bearing face of the semiconductor body, forming an aperture in the layer of passivating material to expose a region of the semiconductor body where the contact is required, providing a layer of aluminum on the passivating material extending through the aperture in the layer of passivating material and over a region remote from the aperture, forming a masking layer of insulating material on said aluminum layer, removing a portion of said masking layer at the region remote from the aperture to expose a portion of the aluminum surface, depositing on at least a region of the exposed aluminum surface a first, temporary, layer of zinc from a solution of zinc oxide and a hydroxide of an alkali metal, removing the first zinc layer by etching with nitric acid solution, depositing on the reexposed region of the aluminum surface a second, permanent, zinc layer in the same manner as the first zinc layer, the second zinc layer initially having an activated surface, and depositing a layer of nickel on the activated surface of the zinc layer by the action of a suitable reducing agent on an acid solution of a nickel salt.

12. A method as claimed in claim 11 in which the exposed nickel surface has been soldered with a tin-based solder and the nickel salt is nickel chloride.

13. A method as claimed in claim 11 in which the reducing agent for the nickel salt is selected from the group sodium hypophosphite and sodium borohydride.

* * * * *